United States Patent
Chan et al.

(10) Patent No.: US 10,564,366 B2
(45) Date of Patent: Feb. 18, 2020

(54) PLUG DEVICE OF OPTICAL MODULES

(71) Applicant: Delta Networks, Inc., Taoyuan (TW)

(72) Inventors: I-Wen Chan, Taoyuan (TW); Shu-Hong Chu, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 0 days.

(21) Appl. No.: 15/994,042

(22) Filed: May 31, 2018

(65) Prior Publication Data

US 2019/0243075 A1 Aug. 8, 2019

(30) Foreign Application Priority Data

Jan. 5, 2018 (CN) .......................... 2018 1 0010848

(51) Int. Cl.
  *G02B 6/38* (2006.01)
  *H05K 1/14* (2006.01)

(52) U.S. Cl.
  CPC ......... *G02B 6/3879* (2013.01); *G02B 6/3843* (2013.01); *G02B 6/3893* (2013.01); *G02B 6/3897* (2013.01); *H05K 1/14* (2013.01); *G02B 6/3885* (2013.01)

(58) Field of Classification Search
  CPC .. G02B 6/3843; G02B 6/3879; G02B 6/3893; G02B 6/3897; H05K 1/14
  See application file for complete search history.

(56) References Cited

U.S. PATENT DOCUMENTS

| | | | | |
|---|---|---|---|---|
| 5,138,680 A | * | 8/1992 | Briggs | G02B 6/3869 250/227.11 |
| 5,329,428 A | * | 7/1994 | Block | G02B 6/4292 361/785 |
| 5,767,999 A | * | 6/1998 | Kayner | G06F 13/409 398/164 |
| 6,986,679 B1 | * | 1/2006 | Aronson | H01R 25/00 439/170 |
| 7,364,373 B2 | * | 4/2008 | Ishikawa | G02B 6/4201 385/89 |
| 8,911,158 B2 | * | 12/2014 | McColloch | H04B 10/14 385/89 |
| 9,246,280 B2 | * | 1/2016 | Neer | G02B 6/4246 |
| 10,114,182 B2 | * | 10/2018 | Zbinden | G02B 6/4268 |
| 2002/0110336 A1 | * | 8/2002 | Dair | G02B 6/4246 385/92 |
| 2005/0169595 A1 | * | 8/2005 | Frohlich | G02B 6/4452 385/135 |
| 2013/0114211 A1 | * | 5/2013 | Regnier | H05K 7/20509 361/704 |
| 2017/0010432 A1 | * | 1/2017 | Xu | G02B 6/4452 |
| 2018/0314024 A1 | * | 11/2018 | Ishimine | H04Q 1/13 |

* cited by examiner

*Primary Examiner* — Daniel Petkovsek
(74) *Attorney, Agent, or Firm* — Muncy, Geissler, Olds & Lowe, P.C.

(57) ABSTRACT

A plug device for plugging in at least two optical modules is provided, wherein the plug device is disposed in a housing and includes a first circuit board, a first connecting module, and a movable module. The first connecting module includes a plurality of electrical connectors, and the movable module includes a plate, at least one frame, and at least one joining member. The electrical connectors are disposed on the first circuit board. The frame is connected to the plate and has a plurality of accommodating portions. The optical modules can be respectively accommodated in the accommodating portions. The plate can be affixed to or separated from the housing by the joining member.

12 Claims, 13 Drawing Sheets

PLUG DEVICE OF OPTICAL MODULES

CROSS REFERENCE TO RELATED APPLICATIONS

The present application is based on, and claims priority from, Chinese Patent Application No. 201810010848.0, filed on Jan. 5, 2018, the disclosure of which is hereby incorporated by reference herein in its entirety.

BACKGROUND OF THE INVENTION

Field of the Invention

The application relates in general to a plug device, and in particular, to a plug device which can simultaneously plug in at least two optical modules.

Description of the Related Art

Computers have been widely applied in all fields, and network technologies have progressed rapidly. Therefore, people can easily access information and service can be provided by way of networks. Due to the enormous data transmission capacity of optoelectronic communication devices, optoelectronic technology seems like a likely candidate for improving transmission quality. The optoelectronics industry, which combines the electronics industry and the optics industry, is currently progressing well. An important device in the optoelectronics industry is an optical module which includes an optical transmitter and an optical receiver, or an optical transceiver combining both functions.

Generally, when an apparatus is in use, a plurality of optical transceivers can be connected thereto. However, when the apparatus or an optical transceiver needs to be maintained or replaced, the user has to manually pull out and insert the optical transceivers one by one. The operation time is therefore increased, and the efficiency of maintenance is reduced. Thus, how to address the aforementioned problem has become an important issue.

BRIEF SUMMARY OF INVENTION

To address the deficiencies of conventional products, an embodiment of the invention provides a plug device for plugging in at least two optical modules, wherein the plug device is disposed in a housing, and includes a first circuit board, a first connecting module, and a movable module. The first connecting module includes a plurality of electrical connectors, and the movable module includes a plate, at least one frame, and at least one joining member. The electrical connectors are disposed on the first circuit board. The frame is connected to the plate and has a plurality of accommodating portions. The optical modules can be accommodated in the accommodating portions. The plate can be affixed to or separated from the housing by the joining member.

In some embodiments, when the frame is guided into the housing, the frame is affixed to the housing by the joining member.

In some embodiments, the frame comprises at least one elastic portion extending toward the accommodating portions.

In some embodiments, the frame comprises a heat sink, disposed on an outer wall of the frame.

In some embodiments, the frame comprises at least one opening, and when the plate is affixed to the housing, the electrical connectors are situated at the opening.

In some embodiments, the frame is affixed to the plate by screwing, welding or riveting.

In some embodiments, the frame of the movable module comprises a first guiding portion, and the first connecting module further comprises a guiding member having a second guiding portion, wherein the first guiding portion can slide along the second guiding portion.

In some embodiments, the guiding member is formed as a cover, disposed on the first circuit board and surrounding the electrical connectors.

In some embodiments, the first connecting module further comprises at least one light pipe, disposed on an inner wall or an outer surface of the cover.

In some embodiments, the light pipe is affixed to the inner wall or the outer surface of the cover by thermal melting or adhering.

In some embodiments, the cover has a plurality of heat dissipating holes.

In some embodiments, the plug device further comprises a second connecting module, disposed on an opposite surface of the first circuit board.

In some embodiments, the plug device further comprises a second circuit board and a second connecting module, and the second circuit board and the second connecting module are disposed in a stacked manner.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the plug device are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Figure 1:
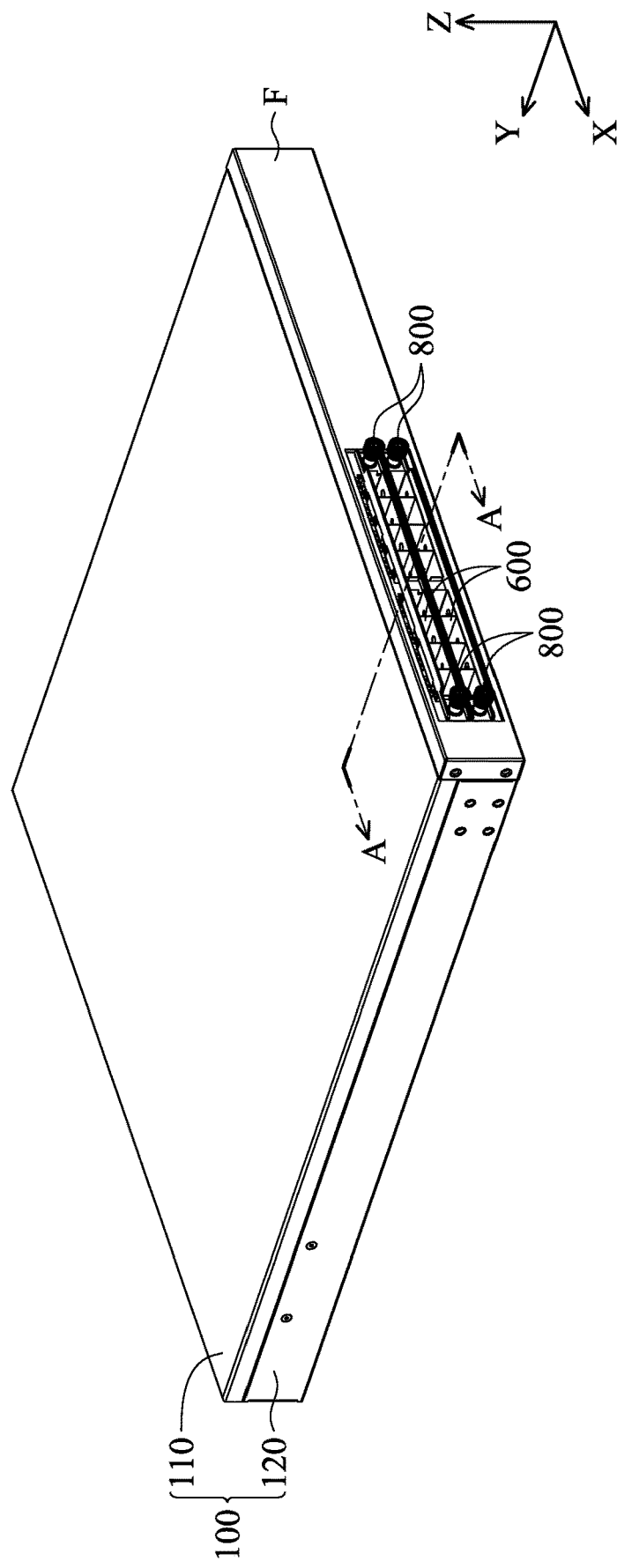
FIG. 1 is a schematic diagram of a plug device in an unfolded state according to an embodiment of the invention.
Figure 2:
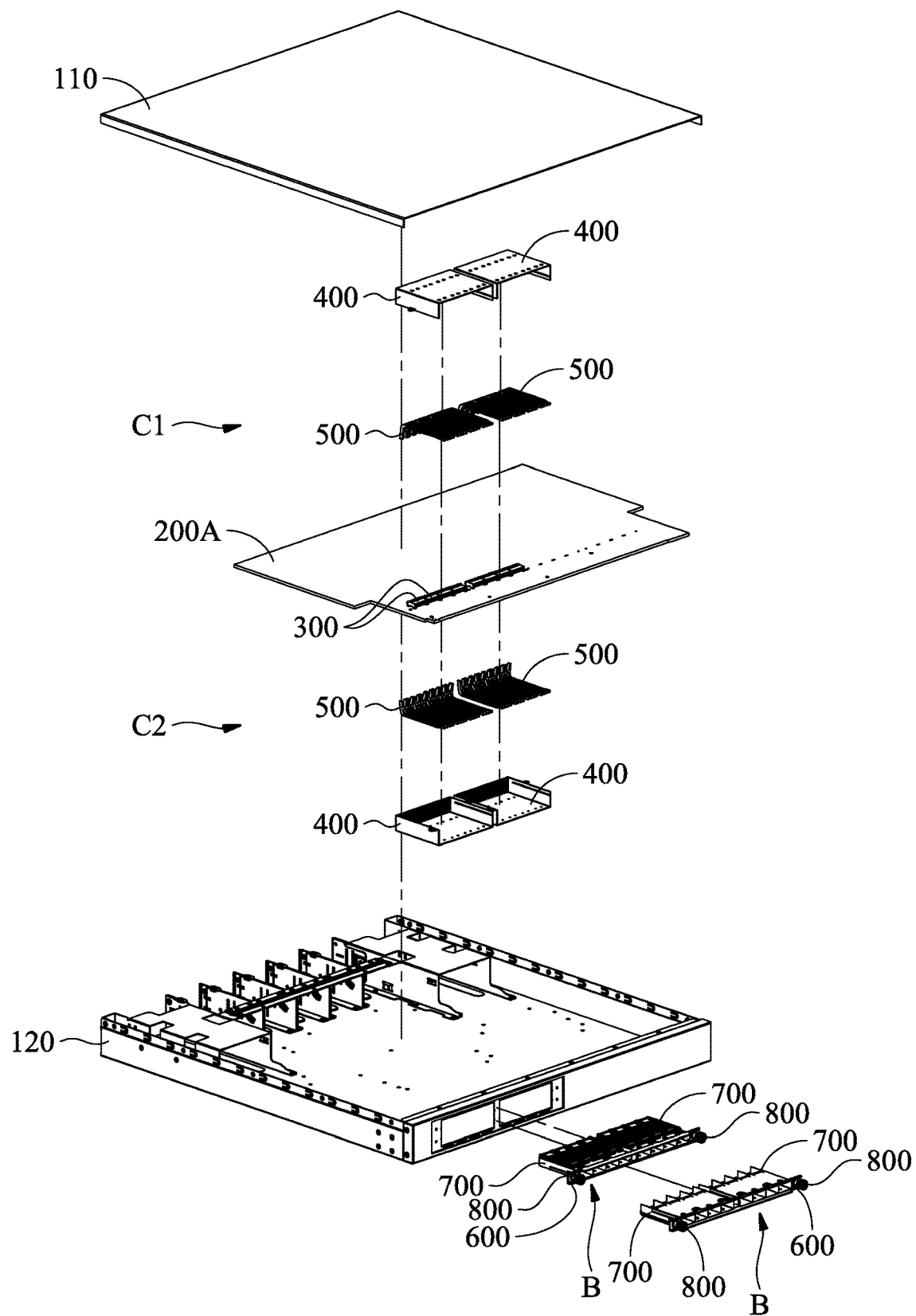
FIG. 2 is an exploded-view diagram of a containing device according to an embodiment of the invention.

Referring to FIGS. 1 and 2, in an embodiment of the invention, a plug device is disposed in a housing 100, and primarily comprises a first circuit board 200A, at least one first connecting module C1, and at least one movable module B. The first connecting module C1 comprises a plurality of electrical connectors 300, at least one guiding member 400, at least one light pipe 500. The movable module B comprises a plate, at least one frame 700, and at least one joining member 800.

The housing 100 is assembled by a case 110 and a base 120, and an accommodating space can formed therebetween. The first circuit board 200A and the first connecting module C1 can be accommodated in the accommodating space, and the movable module B can be connected to the housing 100 in a detachable manner and enter the accommodating space. The specific structures of the components of the first connecting module C1 and the movable module B are discussed below.

Figure 3:
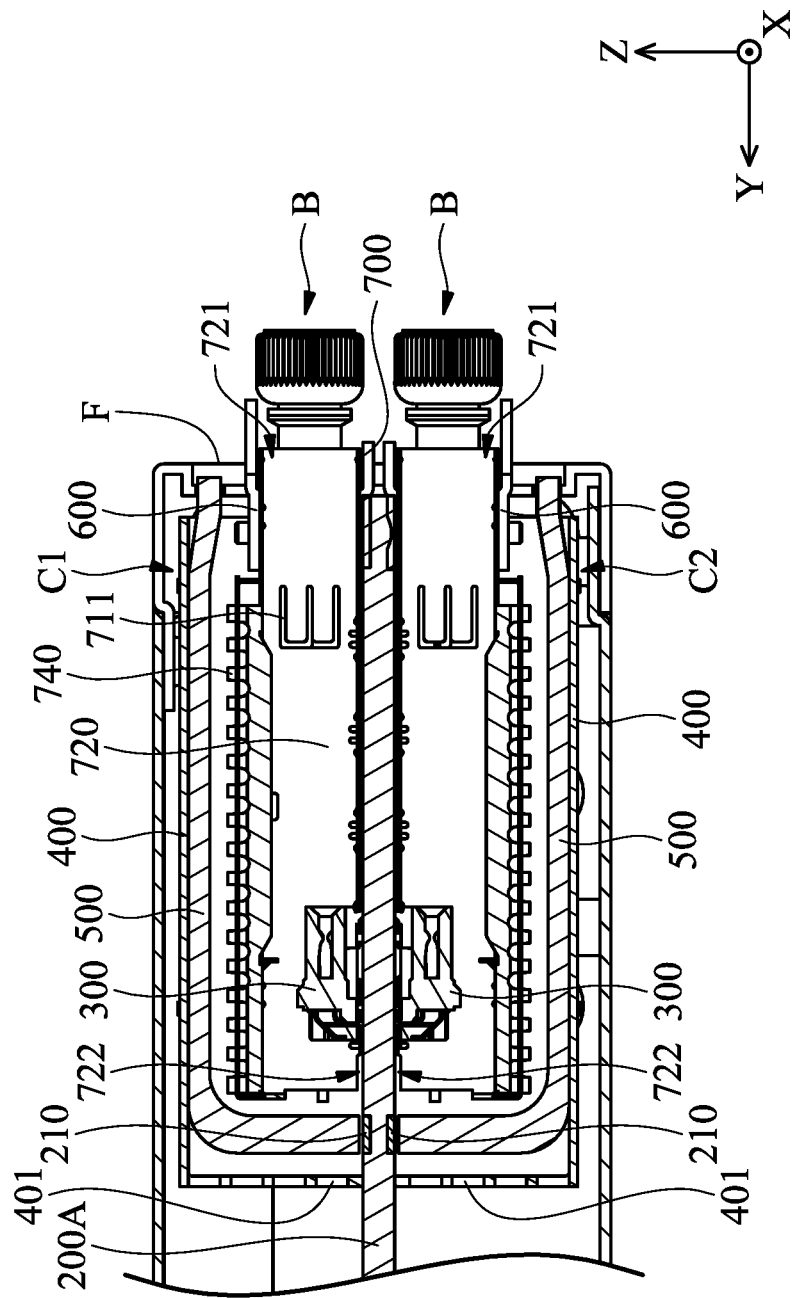
FIG. 3 is a cross-sectional view along the line A-A in FIG. 1.
Figure 4:
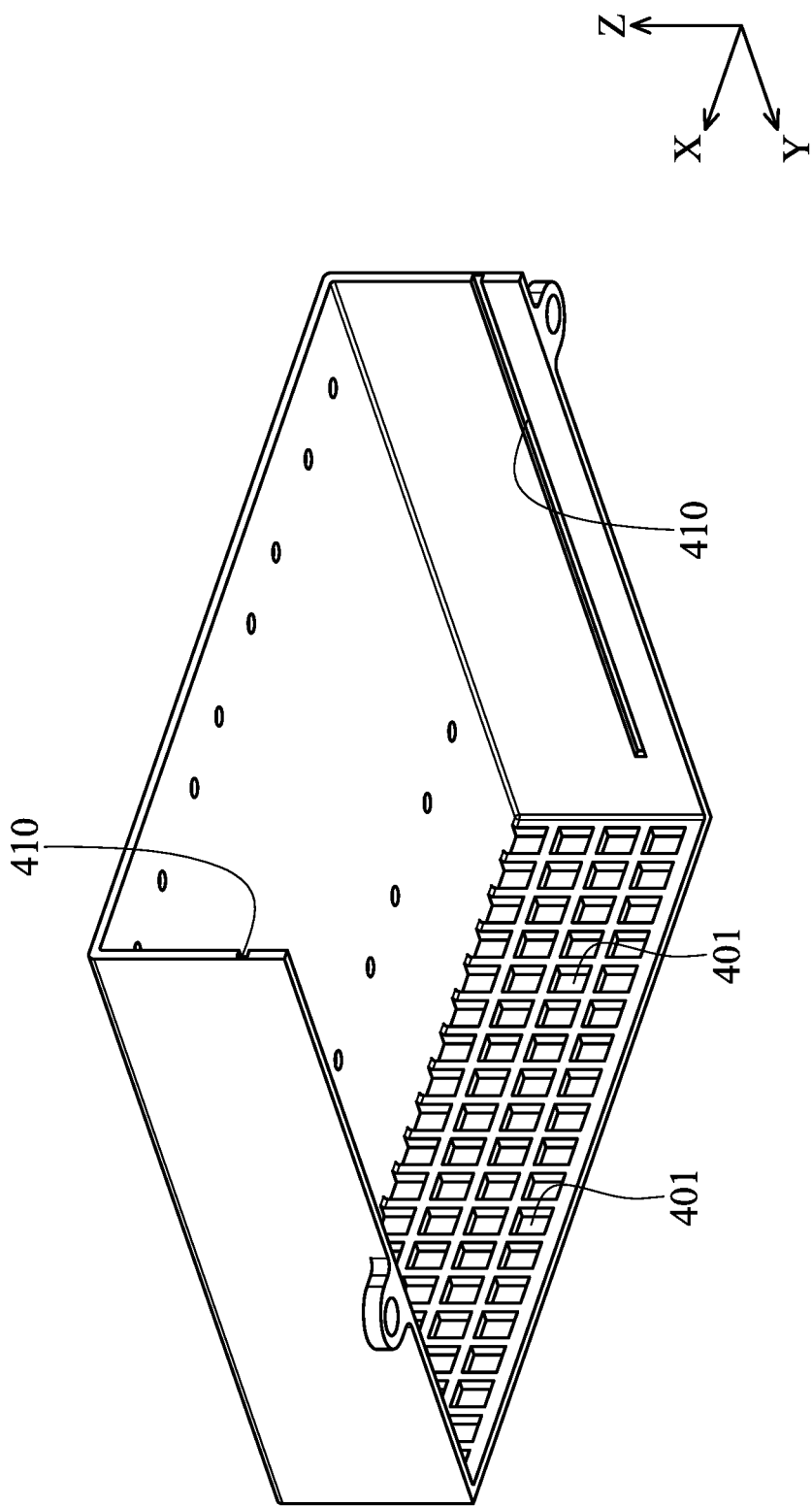
FIG. 4 is a schematic diagram of a guiding member according to an embodiment of the invention.

FIG. 3 is a cross-sectional view along the line A-A in FIG. 1, and FIG. 4 is a schematic diagram of the guiding member 400. As shown in FIGS. 3 and 4, in this embodiment, the electrical connectors 300 and the guiding member 400 are disposed on the first circuit board 200A. The guiding member 400 can be a cover surrounding the electrical connectors 300. Besides the function for guiding, the guiding member 400 can also provide the function for preventing the electromagnetic interference (EMI) between the electrical connectors 300 and other electronic members in the housing 100. The light pipe 500 can be affixed to the inner wall or the outer surface of the cover by thermal melting, adhering, or locking with a screw. One end of the light pipe 500 is adjacent to a light emitting diode 210 on the first circuit board 200, and another end of the light pipe 500 is exposed from the front F of the plug device. Therefore, the light from the light emitting diode 210 can be guided to the front F of the housing 100. The user can note the operation state of an optical module by viewing the light pipe 500.

A plurality of heat dissipating holes 401 are formed on the wall of the cover-shaped guiding member 400 adjacent to the light emitting diode 210. Thus, the heat from the light emitting diode 210 and the optical module can be exhausted therefrom. Furthermore, at least one second guiding portion 410 extending along the Y-axis is formed on the guiding member 400, such as a guiding slot.

Figure 5A:
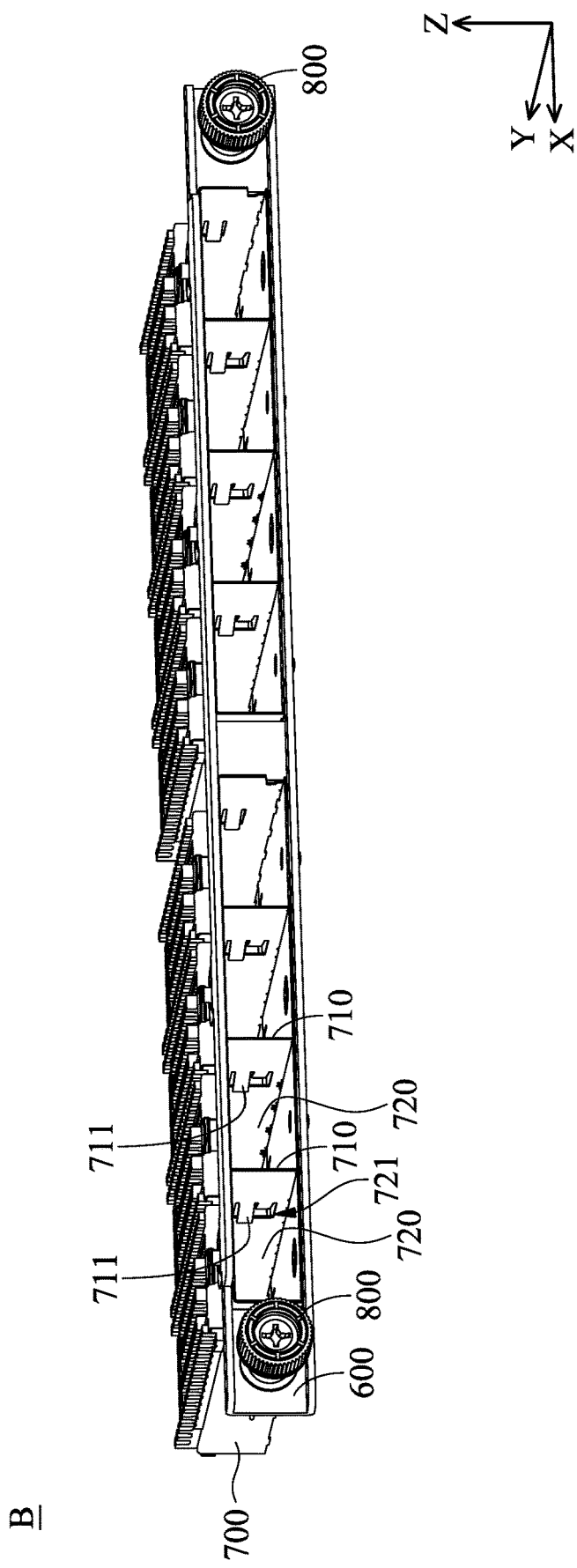
FIG. 5A is a schematic diagram of a movable module according to an embodiment of the invention.
Figure 5B:
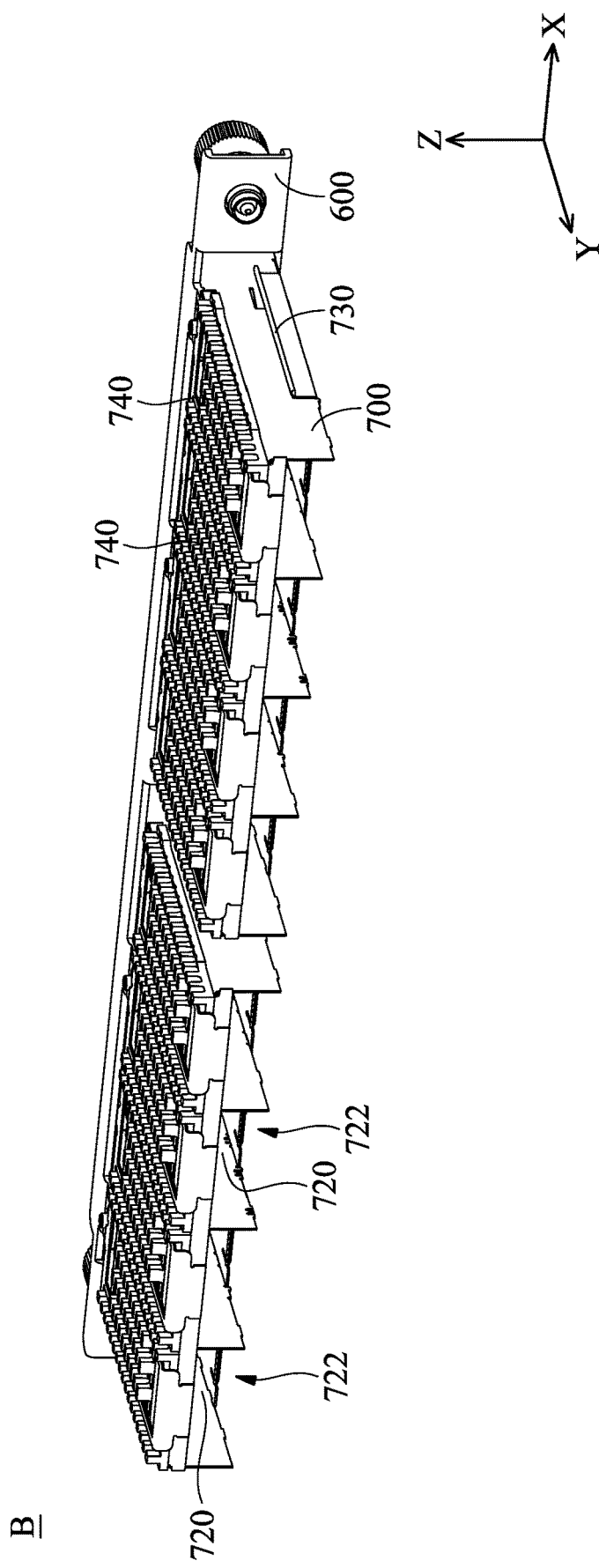
FIG. 5B is a schematic diagram of a movable module in another perspective according to an embodiment of the invention.

Referring to FIGS. 5A and 5B, the frame 700 of the movable module B can be affixed to the plate 600 by screwing, welding or riveting. The plate 600 can be connected to the housing 100 by the joining member 800 in a detachable manner, and the frame 700 can enter the housing 100.

The inner space of the frame 700 can be divided into a plurality of accommodating portions 720 by one or more partitions 710. The partitions 710 have elastic portions 711 extending toward the accommodating portions 720, and opposite ends of each of the accommodating portions 720 respectively form an entrance 721 and an opening 722. As shown in FIG. 3, when the frame 700 enters the housing 100, the electrical connector 300 of the first connecting module C1 is situated at the opening 722.

Referring to FIGS. 5A and 5B, in this embodiment, the frame 700 further comprises a first guiding portion 730 and a heat sink, wherein the heat sink comprises a plurality of heat sink fins 740 formed on the outer wall of the frame 700. The appearance and the position of the first guiding portion 730 correspond to that of the second guiding portion 410, therefore, when the frame 700 enters the housing 100, the first guiding portion 730 can slide along the second guiding portion 410. The heat sink fins 740 are formed on the top of the frame 700. It should be noted that, when the frame 700 enters the housing 100, the light pipe 500 is disposed between the heat sink fins 740 and the guiding member 400, and a gap is formed between the heat sink fins 740 and the light pipe 500. In other words, the heat sink fins 740 do not directly contact the light pipe 500, so as to prevent the friction between the light pipe 500 and the frame 700 during the movement of the frame 700. Wear on the light pipe 500 can be avoided, and unnecessary heat generated by friction can be also avoided.

Figure 6A:
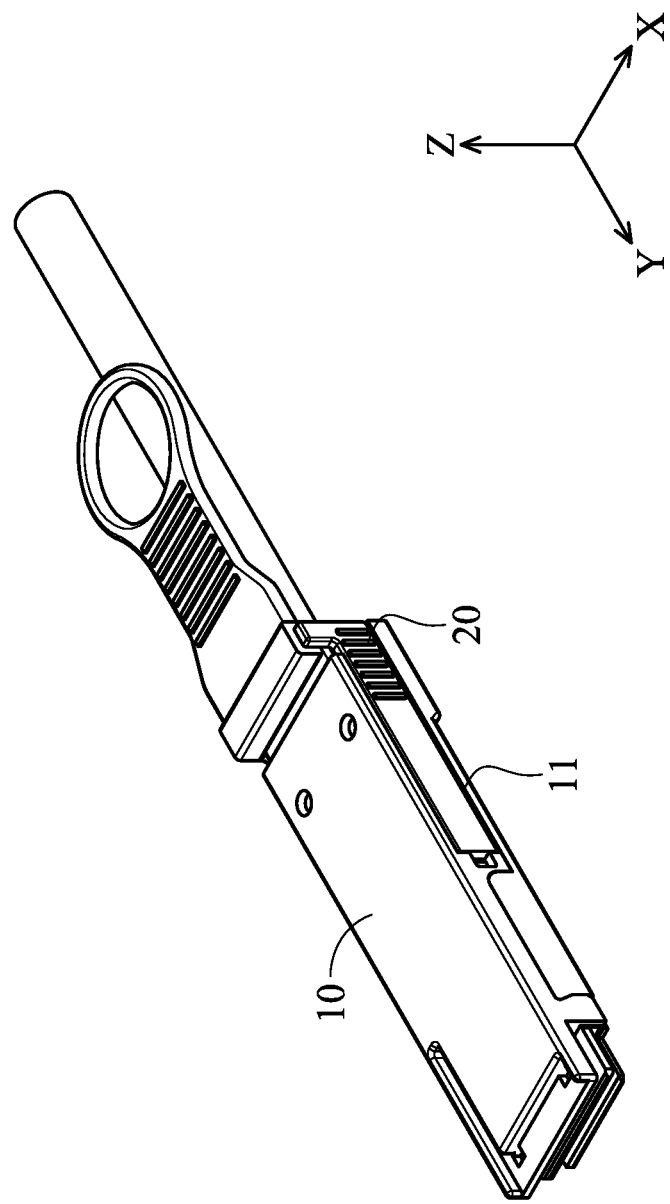
FIG. 6A is a schematic diagram of a general optical transceiver.
Figure 6B:
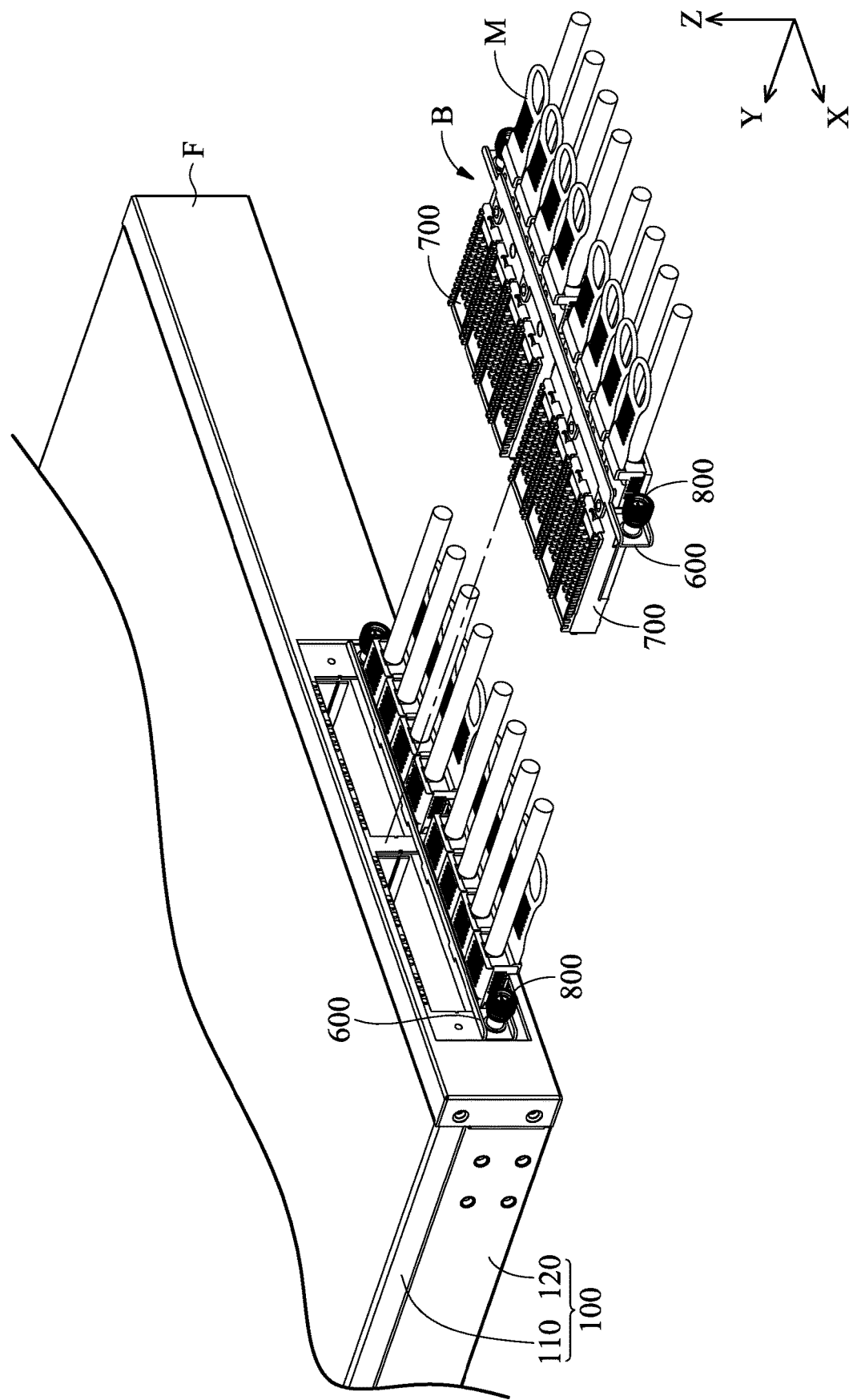
FIG. 6B is a schematic diagram representing a plurality of optical modules connected to the movable module according to an embodiment of the invention.

The steps of connecting the optical module to the plug device are discussed below. Referring to FIGS. 6A and 6B, a general optical transceiver M comprises a main body 10 and a movable portion 20, and the movable portion 20 can slide along a guiding slot 11 on the main body 10. When the user desires to connect a plurality of optical modules M to the plug device, each of the optical modules M can enter the accommodating portion 720 through the entrance 721 of the frame 700 and can be accommodated therein. The elastic portions 711 on the partitions 710 can contact the movable portion 20 and provide elastic force, so as to affix the optical modules M relative to the frame 700.

Figure 6C:
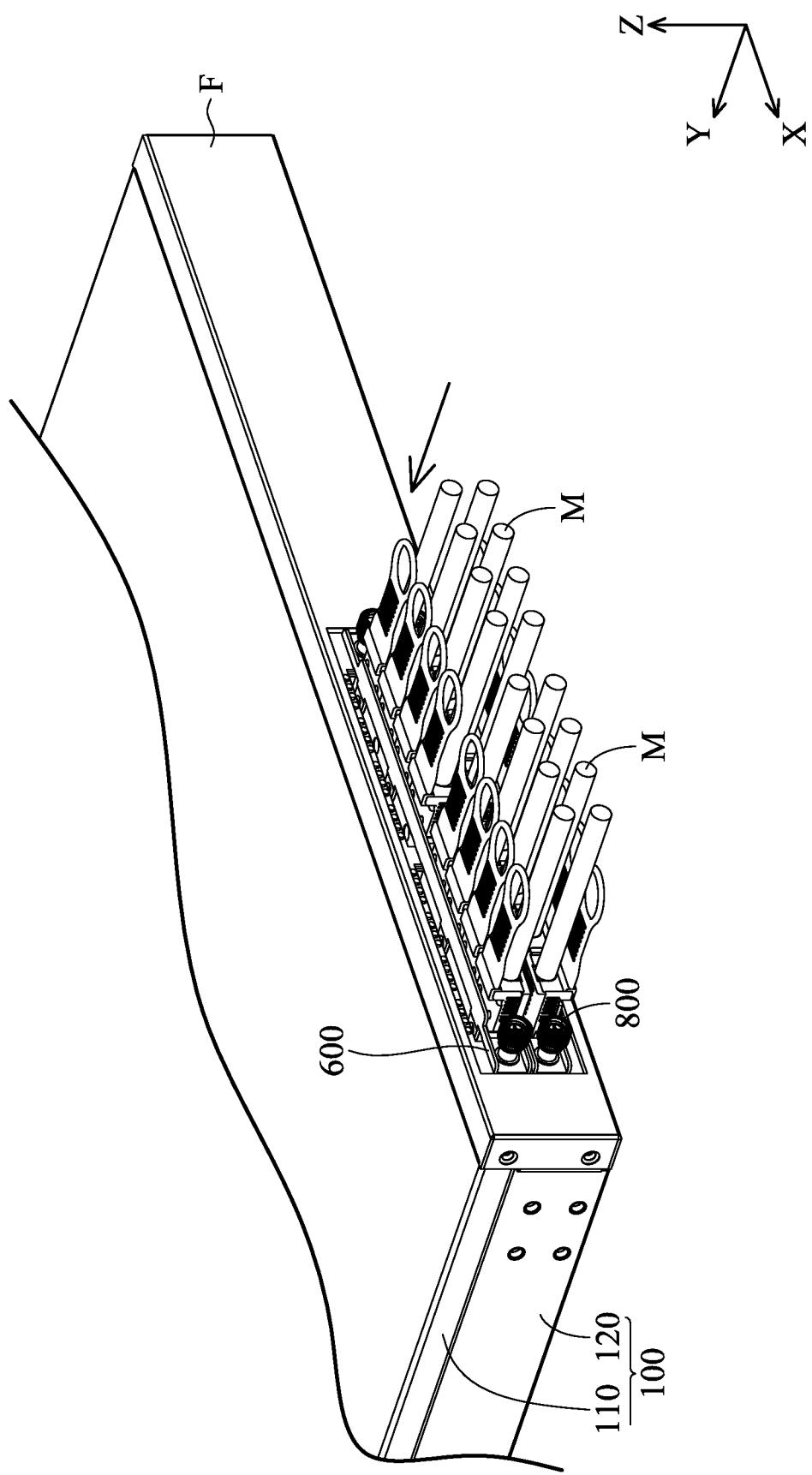
FIG. 6C is a schematic diagram representing the optical modules and the movable module inserting into a housing according to an embodiment of the invention.
Figure 6D:
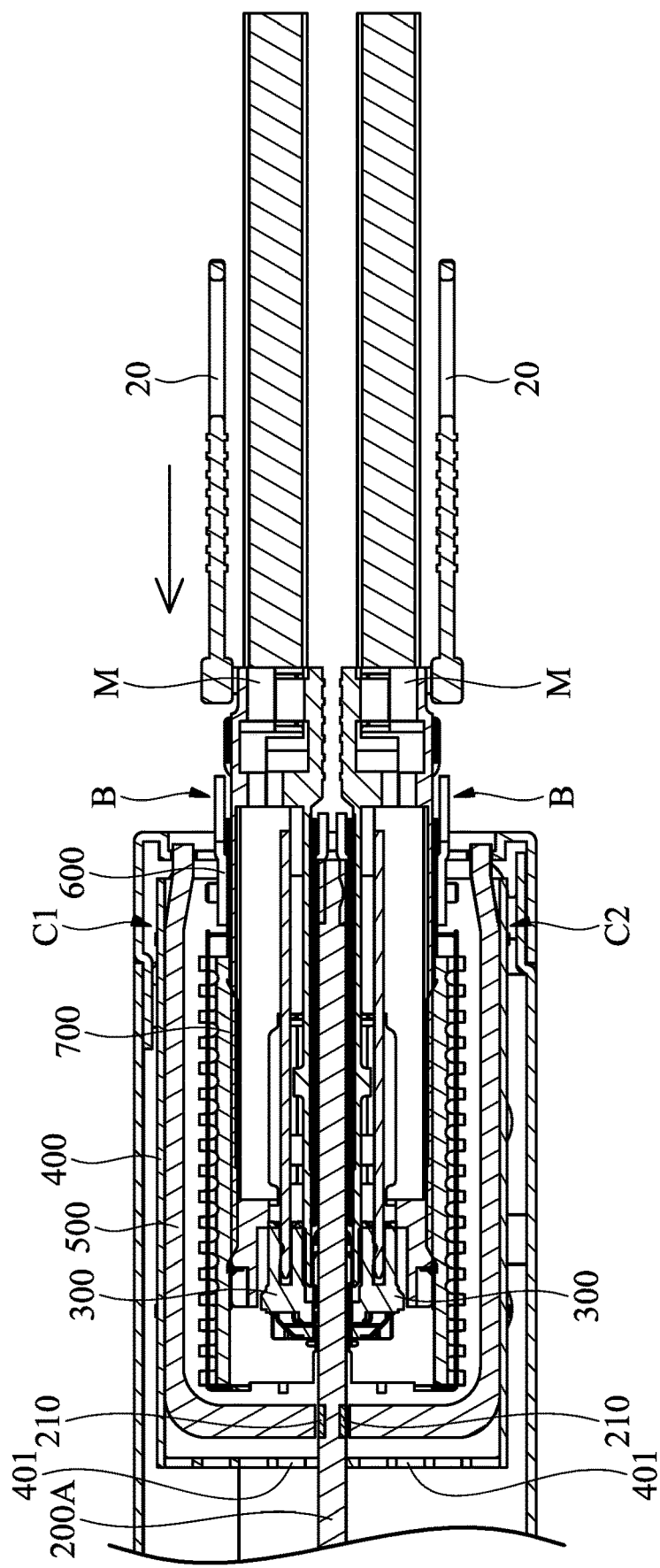
FIG. 6D is a schematic diagram representing the optical modules electrically connected to the electrical connectors according to an embodiment of the invention.

Subsequently, as shown in FIGS. 6C and 6D, the plate 600 can be affixed to the housing 100 by the joining member 800. The frame 700 enters the housing 100 and slides along the second guiding portion 410 of the guiding member 400, and the optical modules M can be connected to the electrical connectors 300.

Figure 6E:
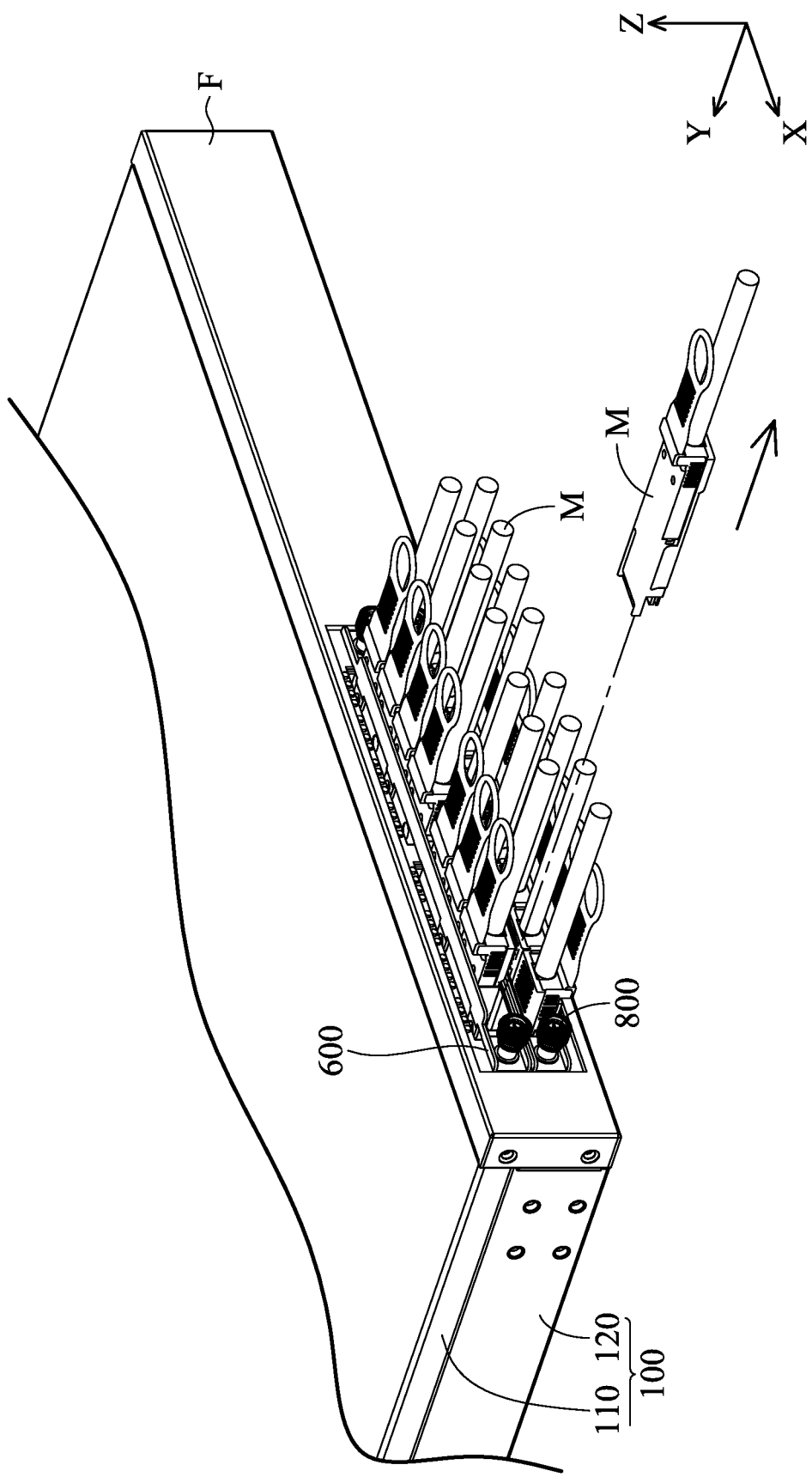
FIG. 6E is a schematic diagram representing one of the optical modules pulled out from the plug device according to an embodiment of the invention.

When the user wants to pull out one of the optical modules M, he can move the movable portion 20 of this optical module M relative to the main body 10 along the −Y-axis. Therefore, the elastic portions 711 can be separated from the movable portion 20, and the user can smoothly pull out the optical module M (as shown in FIG. 6E).

When the user wants to pull out a plurality of optical modules M, he can separate the joining member 800 from the housing 100m and move the movable module B along the −Y-axis. Therefore, all optical modules M disposed on the movable module B can be pulled out simultaneously.

Figure 7:
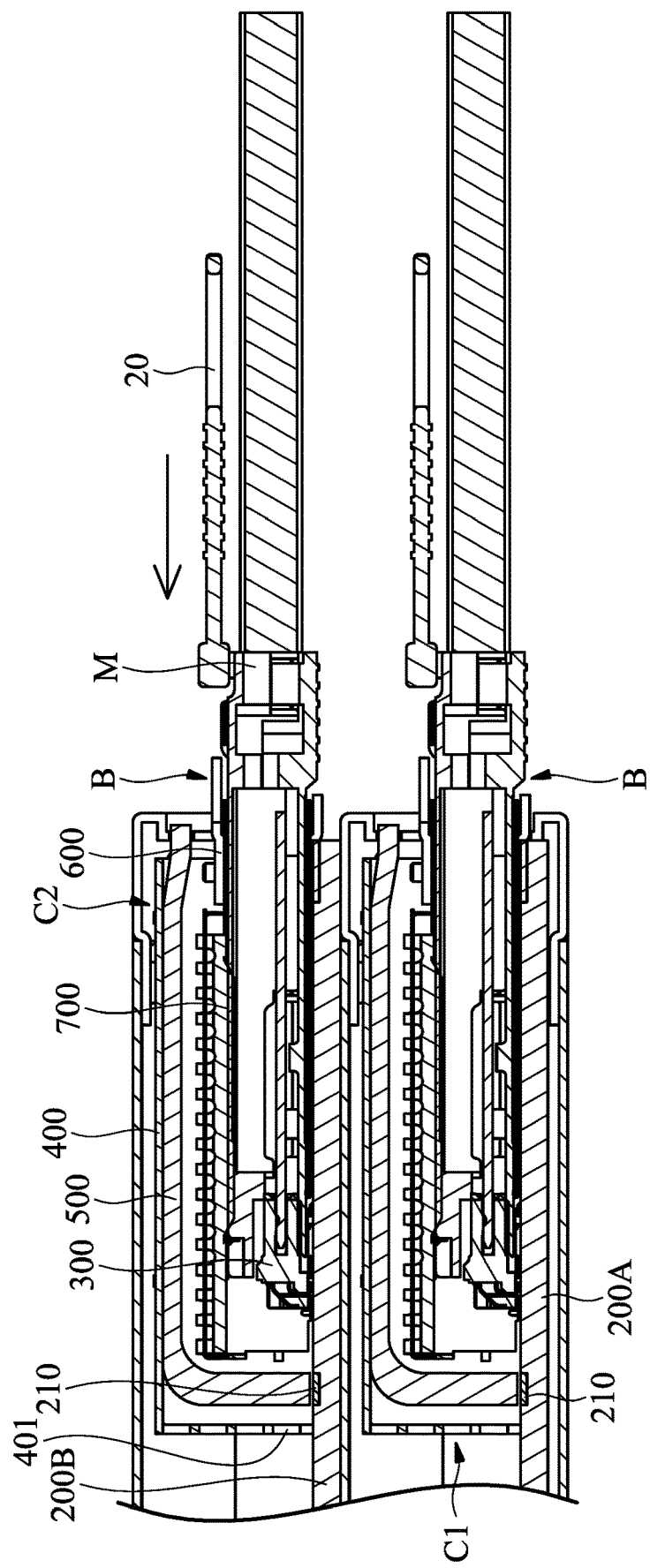
FIG. 7 is a schematic diagram representing a plug device connected to a plurality of optical modules according to another embodiment of the invention.

It should be noted that, as shown in FIG. 3, in order to miniaturize the plug device, a second connecting module C2 is disposed on the opposite surface of the first circuit board 200 in this embodiment. The structure of the second connecting module C2 is the same as the structure of the first connecting module C1. As shown in FIG. 6D, when two sets of the movable module B and the optical modules M are respectively inserted in to the first and second connecting modules C1 and C2 on the opposite surfaces, two sets of the movable module B and the optical modules M are symmetric relative to the first circuit board 200A. That is, the bottoms of the frames 700 of both movable modules B of two sets contact the first circuit board 200A, and the bottoms of the optical modules M of two sets face the first circuit board 200A, so as to prevent that the one set cannot be inserted due to interference. Referring to FIG. 7, in some embodiments, the plug device comprises a first circuit board 200A, the first connecting module C1, the second circuit board 200B, and the second connecting module C2. The second circuit board 200B and the second connecting module C2 are disposed on the first circuit board 200A and the first connecting module C1 in a stacked manner. Therefore, the inserting directions of the movable modules B and the optical modules M are the same, convenient usage can be facilitated.

Figure 8:
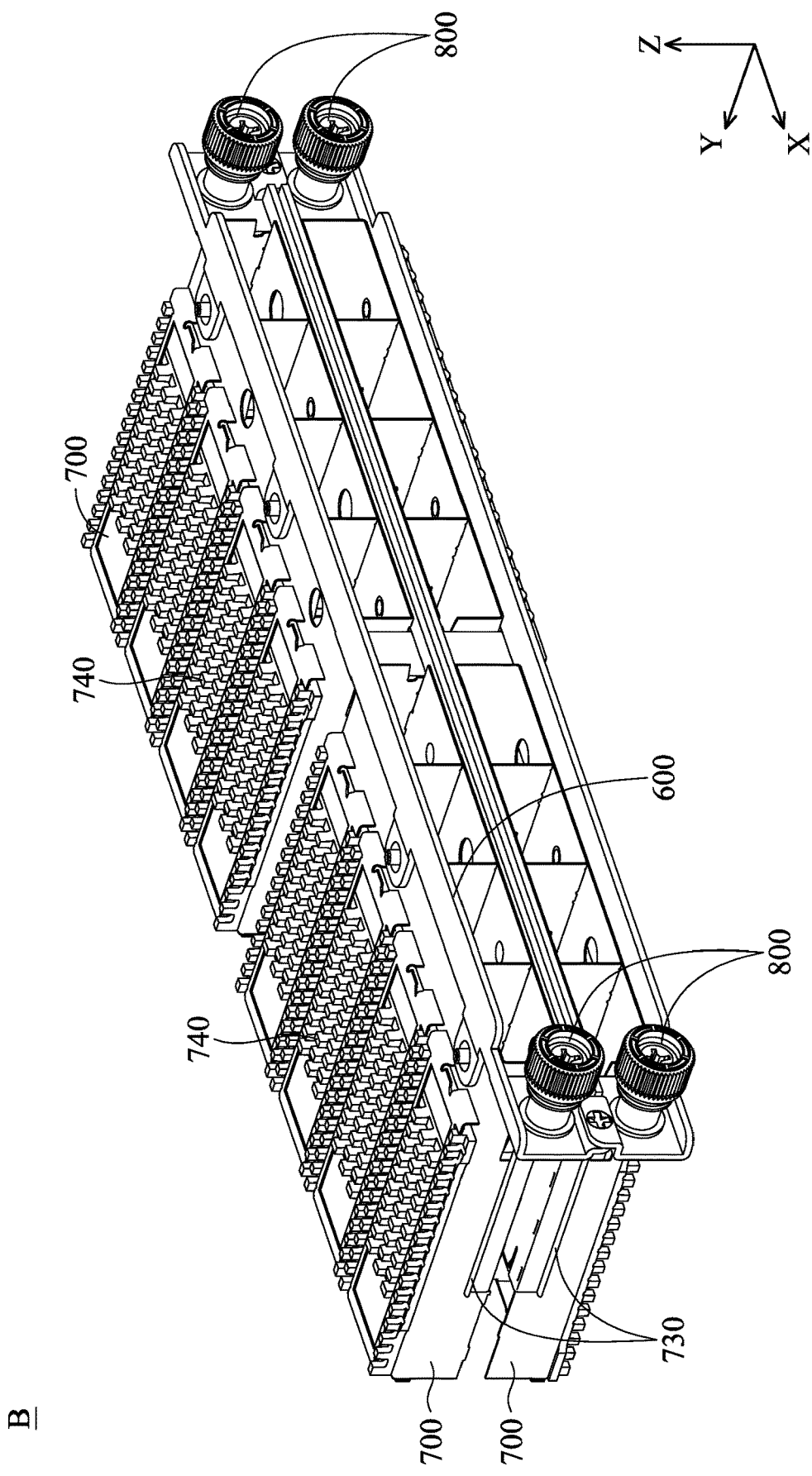
FIG. 8 is a schematic diagram of a movable module according to another embodiment of the invention.

Referring to FIG. 8, in another embodiment, the plate 600 of the movable module B can connect a plurality of frame 700 in the X-axis and the Z-axis. Therefore, more optical modules M can be simultaneously inserted and/or pulled out.

In some embodiments, the guiding member 400 of the connecting module (such as the first connecting module C1 or the second connecting module C2) does not surround the electrical connector 300, and is merely disposed on the position corresponding to the first guiding portion 730 of the frame 700 (for example, a flat member having the second guiding portion 410). In some embodiments, the guiding member 400 and the housing 100 can be integrally formed as one piece, in other words, the second guiding portion 410 can be directly formed on the housing 100. In some embodiments, the guiding member 400 and the light pipe 500 can be omitted for the purpose of weight reduction.

In summary, a plug device for plugging in at least two optical modules is provided, wherein the plug device is disposed in a housing, and includes a first circuit board, a first connecting module, and a movable module. The first connecting module includes a plurality of electrical connectors, and the movable module includes a plate, at least one frame, and at least one joining member. The electrical connectors are disposed on the first circuit board. The frame is connected to the plate and has a plurality of accommodating portions. The optical modules can be accommodated in the accommodating portions. The plate can be affixed to or separated from the housing by the joining member. A plurality of optical modules can be simultaneously inserted or pulled out by the aforementioned plug device, so as to reduce the operation time in usage, inspection or maintenance.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A plug device for plugging in at least two optical modules, wherein the plug device is disposed in a housing and comprises:
   a first circuit board;
   a first connecting module, comprising a plurality of electrical connectors disposed on the first circuit board; and
   a movable module, comprising:
      a plate;
      at least one frame, connected to the plate and having a plurality of accommodating portions, wherein the at least two optical modules are accommodated in the accommodating portions; and
      a joining member, configured to affix the plate with the housing and separate the plate from the housing, wherein the at least one frame of the movable module comprises a first guiding portion, the first connecting module further comprises a guiding member having a second guiding portion, and the first guiding portion can slide along the second guiding portion.

2. The plug device as claimed in claim 1, wherein when the at least one frame is guided into the housing, the at least one frame is affixed to the housing by the joining member.

3. The plug device as claimed in claim 1, wherein the at least one frame comprises at least one elastic portion extending toward the accommodating portions.

4. The plug device as claimed in claim 1, wherein the at least one frame comprises a heat sink, disposed on an outer wall of the at least one frame.

5. The plug device as claimed in claim 1, wherein the at least one frame comprises at least one opening, and when the plate is affixed to the housing, the electrical connectors are situated at the opening.

6. The plug device as claimed in claim 1, wherein the at least one frame is affixed to the plate by screwing, welding or riveting.

7. The plug device as claimed in claim 1, wherein the guiding member is formed as a cover, disposed on the first circuit board and surrounding the electrical connectors.

8. The plug device as claimed in claim 7, wherein the first connecting module further comprises at least one light pipe, disposed on an inner wall or an outer surface of the cover.

9. The plug device as claimed in claim 8, wherein the light pipe is affixed to the inner wall or the outer surface of the cover by thermal melting or adhering.

10. The plug device as claimed in claim 7, wherein the cover has a plurality of heat dissipating holes.

11. The plug device as claimed in claim 1, wherein the plug device further comprises a second connecting module, disposed on an opposite surface of the first circuit board.

12. The plug device as claimed in claim 1, wherein the plug device further comprises a second circuit board and a second connecting module, and the second circuit board and the second connecting module are disposed in a stacked manner.

\* \* \* \* \*